United States Patent [19]

Domrachev et al.

[11] 4,141,778

[45] Feb. 27, 1979

[54] METHOD OF PREPARING CRYSTALLINE COMPOUNDS $A^{IVA}B^{VIA}$

[76] Inventors: Georgy A. Domrachev, ulitsa Minina, 15a, kv. 3; Vyacheslav K. Khamylov, ulitsa Pavlovskaya, 16; Mikhail N. Bochkarev, ulitsa Kavalikhinskaya, 72, kv. 177; Boris V. Zhuk, ulitsa Osharskaya, 61, kv. 4; Boris S. Kaverin, ulitsa Bogorodskogo, 8, kv. 58; Boris A. Nesterov, ulitsa Arkhangelskaya, 9a, kv. 20; Alexandr I. Kirillov, ulitsa Ivlieva, 28, kv. 103, all of Gorky, U.S.S.R.

[21] Appl. No.: 764,539

[22] Filed: Feb. 2, 1977

[30] Foreign Application Priority Data

Feb. 12, 1976 [SU] U.S.S.R. ............................ 2322691

[51] Int. Cl.$^2$ ............................................ B01D 17/26
[52] U.S. Cl. ............................ 156/613; 156/DIG. 72
[58] Field of Search ...................... 156/613, DIG. 72; 23/295 R; 252/62.32 T; 423/509, 561 R; 260/707, DIG. 35

[56] References Cited

U.S. PATENT DOCUMENTS 3,174,823  3/1965  Kopelman ........................... 423/509
3,178,312  4/1965  Johnson ........................... 292/62.32 T

FOREIGN PATENT DOCUMENTS 1010063  11/1965  United Kingdom ...................... 423/509
351476   10/1972  U.S.S.R. ............................ 252/62.3 T

*Primary Examiner*—Hiram H. Bernstein
*Attorney, Agent, or Firm*—Steinberg & Blake

[57] ABSTRACT

A method of preparing crystalline compounds $A^{IVA}B^{VIA}$, wherein $A^{IVA}$ is Si, Ge, Sn, or Pb; and $B^{VIA}$ is S, Se, or Te, which comprises thermal decomposition, at the surface of a substrate heated to a temperature ranging from 250 to 450° C., of an organoelemental compound containing chemically combined elements $A^{IVA}$ and $B^{VIA}$ of the general formula $R_k A_l IVA B_m^{VIA} R'_n$, wherein $A^{IVA}$ is Si, Ge, Sn, or Pb; $B^{VIA}$ is S, Se, or Te; R and R' are hydrogen or an alkyl of 1 to 4 carbon atoms; $k = 0-6$, $l = 1-2$, $m = 1-4$, $n = 0-4$; when $l = 1$, $m = 1-4$; when $l = 2$, $m = 1-2$. The method according to the present invention makes it possible to substantially reduce the decomposition temperature of the starting element organic compound at the substrate surface and to obtain the final products which are stoichiometric in the composition thereof. The present invention is useful in the manufacture of semiconductor elements and protective coatings.

6 Claims, No Drawings

METHOD OF PREPARING CRYSTALLINE COMPOUNDS $A^{IVA}B^{VIA}$

The present invention relates to the preparation of crystalline compounds $A^{IVA}B^{VIA}$ from a vapor phase by thermal decomposition of an organoelemental compound on a heated surface of a substrate. The invention can be used for the manufacture of semiconductor elements and protective coatings.

Known in the art are some methods of preparing crystalline compounds AB. These prior art methods reside in that a mixture of vapours of at least two organoelemental compounds each containing only element A or B are contacted with a heated surface of a substrate, whereat, upon thermal decomposition or as a result of other reactions there is formed a non-volatile crystalline compound AB, while gaseous products are evacuated from the reaction zone.

Particularly known is a method of preparing crystalline compounds $A^{IVA}B^{VIA}$ wherein $A^{IVA}$ is Si, Ge, Sn, or Pb and $B^{VIA}$ is S, Se, or Te, from organoelemental compounds. This prior art method resides in that onto a heated substrate surface there are simultaneously supplied vapours of several organoelemental compounds such as $(C_2H_5)_4Sn$ and $(C_2H_5)_2Te$ for the production of a crystalline compound $A^{IVA}B^{VIA}$ such as SnTe. As a result of thermal decomposition of the organoelemental compound on the substrate surface heated to the temperature of 600° C. and above there are evolved elements $A^{IVA}$ and $B^{VIA}$ such as Sn and Te which then form at the substrate surface a crystalline compound $A^{IVA}B^{VIA}$ such as SnTe; therewith, the process of formation of said crystalline compound proceeds according to the reaction: $A^{IVA} + B^{VIA} \rightarrow A^{IVA}B^{VIA}$. Since said elements are recovered in a free state, the element $B^{VIA}$ such as Te which is more volatile, is sublimed from the substrate surface. Thus, the preparation of the stoichiometric product $A^{IVA}B^{VIA}$ such as SnTe, is hindered.

Principal disadvantages inherent in the prior art methods reside in difficulties in the process control in order to produce crystalline compounds $A^{IVA}B^{VIA}$ stoichiometric in their composition as well as in the necessity of using high temperatures for performing decomposition of the starting organoelemental compounds and formation of the bond $A^{IVA}B^{VIA}$.

It is an object of the present invention to provide such a method of preparing crystalline compounds $A^{IVA}B^{VIA}$ which would make possible substantial reduction in the decomposition temperature of the starting organoelemental compound at the surface of a substrate.

It is another object of the present invention to provide such method of preparing crystalline $A^{IVA}B^{VIA}$ which would make it possible to substantially simplify the process control for the production of the final products stoichiometric in their composition.

These and other objects of the present invention are accomplished by a method of preparing crystalline compounds $V^{IVA}B^{VIA}$, wherein $A^{IVA}$ is Si, Ge, Sn, or Pb and $B^{VIA}$ is S, Se, Te, which comprises thermal decomposition, at the surface of a substrate heated to a temperature within the range of from 250° to 450° C., of an organoelemental compound containing chemically bonded $A^{IVA}$ and $B^{VIA}$ of the general formula $R_kA^{IVA}B_m^{VIA}R'_n$, wherein $A^{IVA}$ and $B^{VIA}$ are as identified above; R and R' are hydrogen, or a $C_1$-$C_4$ alkyl; k = 0 to 6; l = 1-2; m = 1-4; n = 0-4; when l = 1 m = 1-4; when l = 2, m = 1-2.

With the use of the organoelemental compound of the above general formula and as a result of its thermal decomposition at the substrate surface there is evolved a final compound $A^{IVA}B^{VIA}$ (the reaction $A^{IVA} + B^{VIA} \rightarrow A^{IVA}B^{VIA}$ at the substrate surface is eliminated). This fact makes it possible to avoid sublimation of the elements $B^{VIA}$ thus ensuring stoichiometric proportions of the elements.

Owing to the use of an organoelemental compound of the above-given general formula the process control is substantially simplified thus ensuring the production of crystalline compounds $A^{IVA}B^{VIA}$ which are stoichiometric in the composition thereof. In doing so, decomposition of the starting organoelemental compound is effected at the substrate surface having a substantially lower temperature as compared to that employed in the prior art methods, namely within the range of from 250° to 450° C. The crystalline compounds prepared by the method according to the present invention feature high electrophysical properties owing to the stoichiometric compositions thereof.

The method according to the present invention makes it possible to obtain the final products both in the form of crystals having different thickness and in the form of films with a thickness within the range of from 0.1 to 200μ.

It is advisable, for the production of crystalline products $A^{IVA}B^{VIA}$ in the form of films, that use be made as the organoelemental compound, a compound of the above-given general formula, wherein $A^{IVA}$ is Sn, $B^{VIA}$ is Te; R and R' are as identified above; k = 3 l = 1, m = 1, n = = 1; or a compound of the above general formula, wherein $A^{IVA}B^{VIA}$, R and R' are the same, but k = 6, l = 2, m = 1, n = 0; and the thermal decomposition is effected at the substrate surface temperature within the range of from 250° to 375° C.

To prepare the final crystalline products in the form of epitaxial films, it is advisable that said thermal decomposition of an organoelemental compound of the above general formula be carried out upon heating the substrate surface to a temperature within the range of from 275° to 350° C. by means of an isotropic infra-red radiation or an infra-red radiation inclined to the substrate surface at an angle of from 2° to 45°.

The method of preparing crystalline compounds $A^{IVA}B^{VIA}$ is performed in conventional apparatus including an evaporator and a direct-flow reactor. To the heated surface of a substrate placed in a reactor there are fed vapours of an organoelemental compound from an evaporator which vapours are decomposed at the heated substrate surface with evolution of the final crystalline product $A^{IVA}B^{VIA}$. The substrate heating may be performed by any conventional method such as induction heating or thermal heating. The supply of vapours of an organoelemental compound from the evaporator towards the substrate surface can be assured either by a current of an inert gas (nitrogen, argon and the like) or by creating, within the system, a concentration gradient of said compound by means of a vacuum pump.

As substrates at the surface of which it is possible to perform thermal decomposition of an organoelemental compound, use might be made of both single crystalline compounds (for example substrates made of NaCl, KBr, mica) and polycrystalline materials (for example, substrates made of iron, copper, sitall, ceramics).

In the case of using polycrystalline substrates, by the method according to the present invention, it is possible to obtain the final products $A^{IVA}B^{VIA}$ in the form of crystals of various sizes and in the form of polycrystalline films.

In the case of using single crystalline substrates the final products $A^{IVA}B^{VIA}$ are obtained in the form of epitaxial films.

In order to obtain the final products $A^{IVA}B^{VIA}$ in the form of needle-like crystals (whiskers), use might be made as the substrate of both single and polycrystalline materials. In this case, heating of the substrate surface is effected by means of an isotropic infra-red irradiation or infra-red irradiation inclined to the substrate surface at an angle of from 2° to 45° C.

The organoelemental compounds as employed in the method according to the present invention are prepared by conventional techniques such as those, for example, published in "General Chemistry Journal" (Zhournal Obschej Khimii"), vol. 39, 1969, pp. 135-139.

For a better understanding of the present invention, the following specific examples illustrating the method of preparing crystalline compounds are given hereinbelow. The resulting crystalline compounds $A^{IVA}B^{VIA}$ are analysed by means of chemical, X-ray, electronographic methods, as well as by the method of laser mass-spectrometry.

EXAMPLE 1

Bis(triethylsilyl)selenium $[(C_2H_5)_3Si]_2Se$ is evaporated in an evaporator and decomposed at the surface of a sitall substrate heated, by means of an electric coil, to the temperature of 450° C. The vapour pressure of bis(triethylsilyl)selenium within the system is $5 \times 10^{-1}$ mm Hg. As a result, at the substrate surface there is obtained silicon selenide SiSe in the form of a polycrystalline film with the thickness of $5\mu$.

EXAMPLE 2

The process is conducted in a manner similar to that described in the foregoing Example 1, with the only exception that as the starting organoelemental compound use is made of butyltributylgermylsulphide $(C_4H_9)_3GeSC_4H_9$ and this compound is subjected to thermal decomposition at the surface of a glass substrate with the formation of a polycrystalline film of germanium sulphide GeS.

EXAMPLE 3

The process is performed in a manner similar to that described in the foregoing Example 1, with the only exception that as the starting organoelemental compound use is made of trimethylstannyltripropylstannylte llurium $(CH_3)_3SnTeSn(C_3H_7)_3$; this compound is subjected to thermal decomposition at the surface of a quartz substrate heated to the temperature of 300° C. with the formation of a polycrystalline film of tin telluride SnTe.

EXAMPLE 4

The process is performed in a manner similar to that described in Example 1 hereinbefore, except that as the starting organoelemental compound use is made of butyltrimethylplumbylselenium $(CH_3)_3PbSeC_4H_9$ which is then subjected to thermal decomposition at the temperature of 350° C. at the surface of a copper substrate with the formation of a polycrystalline film of lead selenide PbSe with the thickness of $10\mu$.

EXAMPLE 5

The process is conducted in a manner similar to that described in the foregoing Example 1 with the only exception that as the starting organoelemental compound use is made of bis(ethylsulphide)dimethyltin $(CH_3)_2Sn(SC_2H_5)_2$ and this compound is then subjected to thermal decomposition at the temperature of 300° C. at the surface of a silicon substrate with the formation of a polycrystalline film of tin sulphide SnS with the thickness of $100\mu$.

EXAMPLE 6

The process is performed in a manner similar to that described in the foregoing Example 1 with the only exception that as the starting organoelemental compound use is made of tris(butylselenide)methyllead $CH_3Pb(SeC_4H_9)_3$ and this compound is then subjected to thermal decomposition at the temperature of 250° C. at the surface of a sitall substrate with the formation of a polycrystalline film of lead selenide PbSe with the thickness of $7\mu$.

EXAMPLE 7

The process is performed in a manner similar to that described in Example 1 hereinbefore, with the only exception that as the starting organoelemental compound use is made of tetrakis(methyltellurium)germanium $Ge(TeCH_3)_4$; this compound is then subjected to thermal decomposition at the temperature of 400° C. at the surface of a sitall substrate. The reaction is performed in a current of an inert gas (argon) under the total pressure within the system of 200 mm Hg. As a result, at the surface of the substrate there is obtained germanium telluride GeTe in the form of a polycrystalline film with the thickness of $15\mu$.

EXAMPLE 8

The process is conducted in a manner similar to that described in Example 1 hereinbefore, with the only exception that as the starting organoelemental compound use is made of trimethylsilylsulphidesilane $H_3SiSSi(CH_3)_3$ which is then subjected to thermal decomposition at the temperature of 450° C. at the surface of a sitall substrate with the formation of polycrystals of silicon sulphide SiS with the size of $5 \times 5 \times 2$ mm.

EXAMPLE 9

The process is performed in a manner similar to that described in Example 1 hereinbefore, with the only exception that as the starting organoelemental compound use is made of 1,1'-bisethylsulphide tetraethyldistannane $(C_2H_5S)(C_2H_5)_2SnSn(C_2H_5)_2(SC_2H_5)$ and this compound is subjected to thermal decomposition at the temperature of 350° C. at the surface of a substrate made of a sitall with the formation of a polycrystalline film of tin sulphide SnS with the thickness of $40\mu$.

EXAMPLE 10

The process is performed in a manner similar to that described in Example 1 hereinbefore, with the only exception that as the starting organoelemental compound use is made of ethyltriethylstannyltellurium $(C_2H_5)_3SnTeC_2H_5$ and this compound is subjected to thermal decomposition at the temperature of 300° C. at the surface of a substrate made of KBr with the formation of an epitaxial film of tin telluride with the thickness of $1\mu$.

EXAMPLE 11

The process is conducted in a manner similar to that described in Example 1 hereinbefore, with the only exception that as the starting organoelemental compound use is made of bis(tributylstannyl)tellurium [$(C_4H_9)_3Sn]_2Te$ and this compound is subjected to thermal decomposition at the temperature of 375° C. at the surface of a substrate made of KBr with the formation of an epitaxial film of tin telluride with the thickness of 30$\mu$.

EXAMPLE 12

Bis(triethylstannyl)tellurium [$(C_2H_5)_3Sn]_2Te$ is evaporated in an evaporator and subjected to thermal decomposition at the surface of a sitall substrate upon heating the surface to the temperature of 275° C. by means of an infra-red radiation inclined to the substrate surface at the angle of 2°. Pressure of vapours of bis(triethylstannyl)tellurium within the system is $2.10^{-1}$ mm Hg. As a result, whiskers of tin telluride SnTe with a length of 1.5–2 mm are obtained.

EXAMPLE 13

The process is performed in a manner similar to that described in the foregoing Example 12, with the only exception that as the starting organoelemental compound use is made of bis(tripropylgermyl)tellurium [$(C_3H_7)_3Ge]_2Te$ and the surface of a sitall substrate is heated to the temperature of 350° C. by means of an infra-red radiation inclined at the angle of 15° to the substrate surface. The process is conducted in a current of an inert gas (nitrogen) under the total pressure within the system of 810 mm Hg. As a result, whiskers of germanium telluride GeTe with the length of 0.5 mm are obtained.

EXAMPLE 14

Bis(triethylstannyl)sulphide [$(C_2H_5)_3Sn]_2S$ is evaporated and the vapours are subjected to thermal decomposition at the surface of an iron substrate with the heating of the substrate surface to the temperature of 300° C. by means of an infra-red radiation inclined at the substrate surface at the angle of 45°. Pressure of vapours of bis(triethylstannyl)sulphide within the system is maintained equal to 1 mm Hg. As a result, whiskers of tin sulphide SnS with the length of 1 mm are obtained.

EXAMPLE 15

The process is performed in a manner similar to that described in Example 1 hereinbefore, with the only difference that as the starting organoelemental compound use is made of pentaethylpropyltelluriumdistannane $(C_2H_5)_3SnSn(C_2H_5)_2TeC_3H_7$ which is subjected to thermal decomposition at the temperature of 450° C. at the surface of a substrate made of NaCl with the formation of an epitaxial film of tin telluride SnTe with the thickness of 15$\mu$.

Example 16

The process is performed in a manner similar to that described in Example 1 hereinbefore, with the only exception that as the starting organoelemental compound use is made of tributylgermylselenium hydride $(C_4H_9)_3GeSeH$ which is then subjected to thermal decomposition at the temperature of 375° C. at the surface of a sitall substrate. The process is conducted in a current of an inert gas (argon) under the total pressure within the system of 20 mm Hg. As a result, at the substrate surface there is obtained germanium selenide GeSe in the form of a polycrystalline film with the thickness of 12$\mu$.

EXAMPLE 17

Bis(tributylstannyl)tellurium [$(C_4H_9)_3Sn]_2Te$ is evaporated in an evaporator and subjected to thermal decomposition at the surface of a glass substrate upon heating thereof to 350° C. by means of an isotropic infra-red radiation. The pressure of vapours of the bis(tributylstannyl)tellurium within the system is maintained equal to 2 mm Hg. As a result, whiskers of tin telluride SnTe with the length of 2 mm are obtained.

What is claimed is:

1. Method of preparing a crystalline compound of the formula $A^{IVA}B^{VIA}$, wherein $A^{IVA}$ is selected from the group consisting of Si, Ge, Sn, and Pb and $B^{VIA}$ is selected from the group consisting of S, Se, and Te, which comprises bringing vapors of an organoelemental compound of the formula $R_k A_l^{IVA} B_m^{VIA} R'_n$, wherein $A^{IVA}$ and $B^{VIA}$ have the same definitions as above and are chemically combined with each other, and wherein R and R' are each selected from the group consisting of hydrogen and alkyl of 1 to 4 carbon atoms, $k = 0$ to 6, $l = 1–2$, $m = 1–4$ and $n = 0–4$, and when $l = 1$, then $m = 1–4$ and when $l = 2$, then $m = 1–2$ into contact with the surface of a substrate heated to a temperature of 250°–450° C., thus causing thermal decomposition of said organoelemental compound to form said compound $A^{IVA}B^{VIA}$ in crystalline form which remains on the surface of said substrate and volatile products which are removed.

2. The method of claim 1, wherein $A^{IVA}$ is Sn, $B^{VIA}$ is Te, $k = 3$, $l = 1$, $M = 1$, and $n = 1$, and wherein the temperature of the substrate surface is maintained at 250° to 375° C.

3. The method of claim 1, wherein $A^{IVA}$ is Sn, $B^{VIA}$ is Te, $k = 6$, $l = 2$, $m = 1$, and $n = 0$, and wherein the temperature of the substrate surface is maintained at 250° to 375° C.

4. The method of claim 1, wherein said substrate is a single crystalline substrate and the surface temperature thereof is 300° to 450° C.

5. The method of claim 1, wherein the substrate surface is heated to a temperature of 275° to 350° C. by means of an isotropic infra-red radiation.

6. The method of claim 1, wherein the substrate surface is heated to a temperature of 275° to 350° C. by means of an infra-red radiation inclined to the substrate surface at an angle of from 2° to 45°.

* * * * *